United States Patent [19]

Ikeya et al.

[11] Patent Number: 4,719,502

[45] Date of Patent: Jan. 12, 1988

[54] EPOXY RESIN COMPOSITION, AND RESIN-SEALED SEMICONDUCTOR DEVICE IN WHICH THIS COMPOSITION IS USED

[75] Inventors: Hirotoshi Ikeya, Yokosuka; Michiya Higashi, Kawasaki, both of Japan

[73] Assignee: Kabushiki Kaisha Toshiba, Kawasaki, Japan

[21] Appl. No.: 892,436

[22] Filed: Aug. 4, 1986

[30] Foreign Application Priority Data

Aug. 7, 1985 [JP] Japan ................................. 60-172396

[51] Int. Cl.⁴ ............................................. H01L 23/30
[52] U.S. Cl. ........................................ 357/72; 428/76; 525/485
[58] Field of Search ................... 428/76, 414; 357/72; 525/485, 481

[56] References Cited

U.S. PATENT DOCUMENTS 4,572,853  2/1986  Ikeya et al. ...................... 428/414 X

FOREIGN PATENT DOCUMENTS 57-60779  12/1982  Japan .
59-33125   8/1984  Japan .
60-119760  6/1985  Japan .

*Primary Examiner*—Alexander S. Thomas
*Attorney, Agent, or Firm*—Oblon, Fisher, Spivak, McClelland & Maier

[57] ABSTRACT

An epoxy resin composition for sealing, and a resin-sealed type semiconductor device in which this composition is used, of outstanding heat cycle resistance, humidity resistance and laser marking characteristics, can be obtained by using a combination of an organic phosphine compound and a metal complex dye. The epoxy resin composition, characterized in that it consists of epoxy resin, a curing agent having at least 2 phenolic hydroxyl groups per molecule, an organic phosphine compound and a metal complex dye; and to a resin-sealed type semiconductor device characterized in that it is sealed with this composition.

11 Claims, 2 Drawing Figures

EPOXY RESIN COMPOSITION, AND RESIN-SEALED SEMICONDUCTOR DEVICE IN WHICH THIS COMPOSITION IS USED

BACKGROUND OF THE INVENTION

1. Field of the Invention

This invention relates to epoxy resin compositions and resin-sealed type semiconductor devices in which the compositions are used. In more detail, it relates to an epoxy resin composition which when cured has excellent heat cycle resistance, humidity resistance and laser marking characteristics, and to a resin-sealed semiconductor device in which this composition is used.

2. Discussion of Background

Because of their outstanding mechanical characteristics, and excellent electrical characteristics at or near room temperature, epoxy resin compositions have been widely used in recent years, not only for adhesives and coating resins, but also as material for electrical insulation. However, with the level of performance required of electrical insulating material and the like consisting of these epoxy resin compositions rising year by year, it has become difficult to meet this requirement with conventional compositions. A particular problem is that as the temperature of such electrical insulating materials rises, there is a marked drop in their electrical characteristics, and improvement is looked for in this area.

A well-known method of curing epoxy resin is by adding to it a curing catalyst such as a tertiary amine, imidazole, a boron trifluoride monoethylamine complex, a boron trifluoride triethylamine complex, or a boron trifluoride piperidine complex. But a drawback of epoxy resin compositions cured in this way was that their electrical characteristics were not good enough, particularly at high temperatures. Another drawback of such compositions was their high level of moisture absorption, which meant that when used for electrical insulating material and the like they were liable to deteriorate through corrosion.

Earlier, a hermetic sealing technique using metal or ceramic was employed to protect semiconductor elements of integrated circuits (IC's), large-scale integrated circuits (LSI's), transistors, diodes, etc. from the outside atmosphere and from mechanical shock. Recently, however, the economic advantage which resin enjoys over other materials has led to sealing with resin, particularly thermosetting resin, becoming the commonest technique.

Epoxy resin compositions for low pressure moulding, which can be used in the low pressure transfer moulding process (which is suited to mass production) are widely used as the resin for such sealing of semiconductors. However, the conventional resin-sealed semiconductor devices obtained by transfer-moulding an epoxy resin composition consisting of (for example) epoxy resin, novolac type phenol resin curing agent, imidazole curing accelerator, carbon black, etc. had a number of drawbacks. One such drawback was that the resin and the semiconductor device sealed by the resin had different thermal expansion coefficients, and the mechanical stress caused by this difference when the semiconductor device was repeatedly exposed to high or low temperatures could lead to breaking of the bonding wires, or to poor connections, within the sealed device.

A further problem was that when the semiconductor device was used in situations of high temperature and humidity, the moisture in the air permeated the resin sealing the device and penetrated within the seal to the semiconductor element itself, which was liable to cause corrosion of the aluminium wiring within the device, resulting in the deterioration of the latter.

A recent development is the use of 'laser marking', in which the surface of the resin sealing a semiconductor is irradiated briefly with a laser beam, in place of the conventional printing with marking ink. But when this process is applied to the epoxy resin compositions conventionally used for sealing, there is no sharp contrast between the marked and unmarked parts, so that only unclear marking is obtained.

OBJECT OF THE INVENTION

The objects of the invention are to improve the drawbacks of conventional epoxy resin compositions used for sealing, and of the resin-sealed type semiconductor devices in which these compositions are used; and to provide an epoxy resin composition for sealing, and a resin-sealed type semiconductor device in which this composition is used, of outstanding characteristics.

SUMMARY OF THE INVENTION

As the result of assiduous and prolonged research directed at achieving the above-mentioned aims, the present inventors discovered that an epoxy resin composition for sealing, and a resin-sealed type semiconductor device in which this composition is used, of outstanding heat cycle resistance, humidity resistance and laser marking characteristics, can be obtained by using a combination of an organic phosphine compound and a metal complex dye.

Specifically, the invention relates to an epoxy resin composition, characterized in that it comprises of epoxy resin, a curing agent having at least 2 phenolic hydroxyl groups per molecule, an organic phosphine compound and a metal complex dye; and to a resin-sealed type semiconductor device characterized in that it is sealed with this composition.

The epoxy resin which is the first essential ingredient in the composition of the invention is an ordinary known epoxy resin, and no particular restriction applies. The following may be cited by way of example: epoxy resins having at least 2 epoxy groups in 1 molecule, including glycigyl-ether type epoxy resin such as bisphenol A type epoxy resin, novolac type epoxy resin, glycigyl-ester type epoxy resin, glycigyl-amine type epoxy resin, linear aliphatic epoxy resin, alicyclic epoxy resin, heterocyclic epoxy resin and halogenated epoxy resin. These epoxy resins may be used either singly or in a mixed system of two or more. Especially to be preferred are novolac type epoxy resins of an epoxy equivalent of 170–300: for example, phenol-novolac type epoxy resin, cresol-novolac type epoxy resin, halogenated phenol-novolac type epoxy resin. With these epoxy resins, the chlorine ion content should preferably be less than 10 ppm, and the hydrolyzable chlorine content less than 0.1 weight %. The reason for this is that if the epoxy resin contains chlorine ions in excess of 10 ppm or hydrolyzable chlorine in excess of 0.1 weight %, the aluminium electrodes of the sealed semiconductor element are liable to corrode.

The curing agent having at least 2 phenolic hydroxyl groups per molecule, which is the second essential ingredient in the composition of the invention, is anyone of phenol resin, polyhydroxystyrene, phenol aralkyl resin and polyhydric phenol compounds. Specific examples are novolac type phenol resins such as phenol novolac resin, cresol novolac resin, tert-butyl phenol novolac resin, and nonyl phenol novolac resin, resol type resin, polyhydroxystyrenes such as polyparahydroxystyrene, bisphenol A, etc., and halides of these. Among these, novolac type phenol resin, phenol aralkyl resin and polyhydroxystyrenes are the most preferred. These curing agents can be used either singly or in mixed systems of two or more.

The proportions in which the epoxy resin and the curing agent should be mixed in the composition of the invention should be such that the ratio of the phenolic hydroxyl groups in the curing agent and the epoxy groups in the epoxy resin (number of hydroxyl groups/number of epoxy groups) is within the range 0.5–1.5, and preferably 0.7–1.2. If the proportions are outside this range, the curing reaction will not proceed so easily, and there may be some deterioration in the various characteristics of the cured product.

Compounds expressed by the general formula

can be used for the organic phosphine compound which is the third essential ingredient in the composition of the invention. Specifically, the following may be cited: tertiary phosphine compounds in which $R_1$–$R_3$, are all organic groups: secondary phosphine compounds in which any one is a hydrogen atom: or primary phosphine compounds in which any two are hydrogen atoms. The following may be cited as examples of compounds which meet these requirements: triphenylphosphine, tributylphosphine, tricyclohexylphosphine, methyldiphenylphosphine, butylphenylphosphine, diphenylphosphine, phenylphosphine, octylphosphine. Further, $R_1$ in the formula given above can be an organic group including organic phosphines. Examples in this case are 1,2-bis(diphenyl-phosphino)ethane and bis(diphenylphosphino)methane and the like. Arylphosphine compounds are preferred, such as triphenylphosphine, tritolylphosphine, 1,2-bis(diphenylphosphino)ethane, bis(diphenylphosphino)methane. The organic phosphine compounds mentioned above can be used either singly or in a mixed system of two or more.

The proportion of organic phosphine compounds in the composition of the invention is 0.001 to 20 weight parts, and preferably 0.01 to 5 weight parts to 100 weight parts of resin in the composition.

The metal complex dye which is the fourth essential ingredient in the composition of the invention is not subject to any special restrictions, so long as it contains in its molecule metal in the form of a complex salt. Specific examples of dyes which may be used are acid dyes and direct dyes. An example of an acid dye is 0.0′-dioxyazo dye containing chromium as the principal metal. In this case, the bonding ratio of the dye molecules and chromium atoms should be 1:1 or 2:1. Alternatively, the metal contained in the dye could be iron, cobalt, nickel, or titanium, etc. Examples of direct dyes are copper complex salts of 0.0′-dioxyazo or 0-oxy-0′-carboxyazo direct azo dyes.

The proportion of the metal complex dye in the composition of the invention is 0.01 to 20 weight parts, preferably 0.05 to 10 weight parts, to 100 weight parts of the composition. If it is less than 0.01 weight part, colouring will be insufficient, and the contrast when marking is carried out will not be clear; while if it exceeds 20 weight parts, the properties of the composition after curing will be adversely affected. Further other dyes or pigments may be added to the metal complex dye as necessary.

Since infrared radiation transmits through metal complex dye, when semiconductor device is sensitive to infrared or visible radiation, it is preferred to add a pigment or another dye besides a metal complex dye.

Specific examples of the pigment are carbon black, titanium dioxide, cobalt oxide, iron blue, titanium yellow, black titanium oxide, black iron oxide, azo pigments, lake pigments, perinone, perylene and aniline black, etc. Specific examples of the other dye are azoic dyes, and solvent dyes, etc.

Inorganic fillers may be added to and mixed with the composition of the invention as necessary, with the object of reducing the difference in thermal expansion coefficient between the sealing resin and the sealed part (semiconductor element, bonding wires, lead frame, etc.), and thus of minimizing the faults such as breaking of bonding wires that can develop because of this large difference in thermal expansion coefficient. Quartz glass powder, crystalline silica powder, glass fibre, talc, alumina powder, calcium silicate powder, calcium carbonate powder, barium sulphate powder, magnesia powder, etc. may be used in this case as organic fillers. Of these, quartz glass powder and crystalline silica powder are preferred, because of their high degree of purity and low thermal expansion coefficient. The amount of these inorganic fillers to be added will vary with the type of epoxy resin, curing agent and filler; but an example in the case of transfer moulding would be 1.5 to 4 times the total amount of epoxy resin and curing agent (weight ratios). Grain size distribution in the inorganic filler, can be made more uniform by mixing coarse and fine grains. This improves mouldability.

Further, there is no objection to adding other additives to the composition of the invention in appropriate amounts as required, for example mould releasing agents such as natural wax, synthetic wax, metallic salts of normal fatty acids, acid amides, esters or paraffins; fire retardants such as chlorinated paraffin, bromotoluene, hexabromobenzene, antimony trioxide; or silane coupling agents. The usual method of preparing the kind of epoxy resin composition for sealing described above for use as a moulding material is to mix the raw material ingredients (selected in the prescribed proportions) thoroughly in e.g. a mixer, after which epoxy resin moulding material is easily obtained by further mixing, which is either fusion-mixing, using a heated roll, or by mixing in a kneader.

The resin-sealed type semiconductor device of the invention can be manufactured without difficulty by sealing a semiconductor device with the epoxy resin sealing composition described above. The most common method of sealing is low-pressure transfer moulding, but injection moulding, compression moulding and cast moulding can also be used. When sealing, the epoxy resin composition is cured by heating, and at the end of the process a resin-sealed type of semiconductor device is obtained, sealed by this cured composition. When curing, the composition is preferably heated to at least 150° C.

As described above, the composition of this invention is such that by the combination of organic phosphine compound and metal complex dye, a resin-sealed type semiconductor device can be obtained which, because of the excellent heat cycle resistance and humidity resistance of the composition after curing, is highly reliable. Furthermore, the metal complex dye which is an essential ingredient of the composition of the invention has the effect that clearer printing can be obtained when laser marking is applied to the cured composition of the invention after it has been used to seal a semiconductor device. The industrial value of the invention is thus very great.

DETAILED DESCRIPTION OF THE PREFERRED EMBODIMENTS

The invention is further described below, with reference to embodiments of the invention and comparative examples.

Embodiments of the Invention 1 to 3 and Comparative Examples 1 to 7

The compositions of the embodiments of the invention and comparative examples were manufactured with the ingredients mixed in the proportions shown in Table 1. Of the essential ingredients of the composition of the invention, the epoxy resins used were: cresol novolac type epoxy resin (epoxy equivalent 220, referred to below as "epoxy resin A"), and brominated epoxy novolac resin (epoxy equivalent 290, referred to below as "epoxy resin B"). The curing agent having at least two phenolic hydroxyl groups per molecule which was used was phenol-novolac resin (hydroxyl group equivalent 107); referred to below simply as "curing agent"). The organic phosphine compound used was triphenylphosphine. The metal complex dyes used were chromium complex salt of black 0,0'-dioxyazo dye (metal complex dye (I)), and cobalt complex salt of black 0,0-dioxyazo dye (metal complex dye (II)).

Of the ingredients added other than the essential ingredients mentioned above, DBU is an abbreviation for diaza-bicyclo(5,4,0)undecene-7; the azo dye and solvent dye were both black and contained no metal complex dyes.

Figure 1:
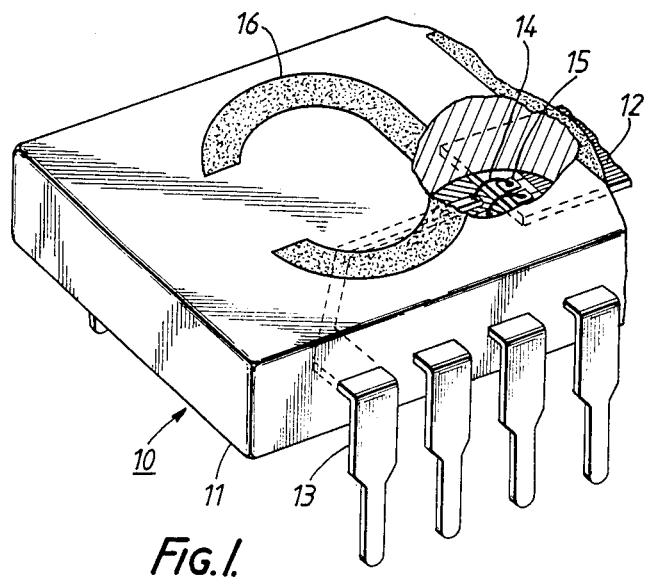
FIG. 1 is a schematic perspective view of a semiconductor device with part cut out, illustrating an embodiment of the invention.

The ingredients listed in Table 1 were mixed in a mixer and then kneaded together by means of a roll, to give the compositions of the embodiments and the comparative examples. Using the compositions thus obtained, an MOS integrated circuit was sealed in each case by transfer moulding for 2 minutes at 170° C. The sealed semiconductor device was then after-cured for 4 minutes at 180° C. The resin-sealed type semiconductor devices thus obtained were then submitted to the evaluation tests described below. As shown in FIG. 1, which is a drawing of the device with a part cut out, semiconductor device 10 has semiconductor element 12 of the MOS integrated circuit, part of lead wires 13, and bonding wires 14 connected to them, sealed by resin sealing part 11 consisting of this composition. 15 indicates the aluminium electrodes or aluminium wiring etc. formed on element 12. 16 indicates the pattern formed by marking.

TABLE 1

|  | Embodiments | | | Comparative Examples | | | | | | |
| --- | --- | --- | --- | --- | --- | --- | --- | --- | --- | --- |
|  | 1 | 2 | 3 | 1 | 2 | 3 | 4 | 5 | 6 | 7 |
| Epoxy resin A | 180 | 180 | 180 | 180 | 180 | 180 | 180 | 180 | 180 | 180 |
| Epoxy resin B | 20 | 20 | 20 | 20 | 20 | 20 | 20 | 20 | 20 | 20 |
| Phenol resin | 90 | 90 | 90 | 90 | 90 | 90 | 90 | 90 | 90 | 90 |
| Triphenyl phosphine | 5 | 5 | 5 | 5 | 5 | 5 | — | — | — | — |
| DBU | — | — | — | — | — | — | 5 | 5 | 5 | — |
| 2-heptadecyl imidazole | — | — | — | — | — | — | — | — | — | 5 |
| Metal complex dye (I) | 4 | — | 2 | — | — | — | 4 | — | — | — |
| Metal complex dye (II) | — | 4 | 2 | — | — | — | — | — | — | 4 |
| Azo dye | — | — | — | 4 | — | — | — | 4 | — | — |
| Solvent dye | — | 0.5 | — | — | 4 | — | — | — | — | — |
| Carbon black | — | 0.5 | 0.5 | — | — | 4 | — | — | 4 | — |
| Fused silica powder | 700 | 700 | 700 | 700 | 700 | 700 | 700 | 700 | 700 | 700 |
| Antimony trioxide | 20 | 20 | 20 | 20 | 20 | 20 | 20 | 20 | 20 | 20 |
| Carnauba wax | 4 | 4 | 4 | 4 | 4 | 4 | 4 | 4 | 4 | 4 |
| Silane coupling agent | 4 | 4 | 4 | 4 | 4 | 4 | 4 | 4 | 4 | 4 |

(1) Heat cycle resistance test

A hundred in each case of the above-mentioned resin-sealed type semiconductor devices were left in a thermostatic chamber at +200° C. for 30 minutes, after which they were taken out and left at normal temperature for 5 minutes. Next, they were left in a thermostatic chamber at −65° C. for 30 minutes, after which they were taken out and left once again at normal temperature for 5 minutes. Taking this sequence of operations as one cycle, the sequence was repeated for the number of cycles shown in Table 2, and the number of devices which deteriorated in each cycle was measured. Measurement was carried out by means of a tester. The results are shown in Table 2.

TABLE 2

| Heat cycle test: Cumulative deterioration rate (%) | | | | | |
| --- | --- | --- | --- | --- | --- |
|  | Number of cycles | | | | |
|  | 100 | 200 | 300 | 400 | 500 |
| Embodiment 1 | 0 | 0 | 0 | 1 | 32 |
| Embodiment 2 | 0 | 0 | 0 | 3 | 41 |
| Embodiment 3 | 0 | 0 | 0 | 8 | 65 |
| Comparative example 1 | 45 | 78 | 100 | — | — |
| Comparative example 2 | 51 | 83 | 100 | — | — |
| Comparative example 3 | 52 | 86 | 100 | — | — |
| Comparative example 4 | 64 | 93 | 100 | — | — |
| Comparative example 5 | 73 | 100 | — | — | — |
| Comparative example 6 | 77 | 100 | — | — | — |

TABLE 2-continued

| Heat cycle test: Cumulative deterioration rate (%) | | | | | |
|---|---|---|---|---|---|
| | Number of cycles | | | | |
| | 100 | 200 | 300 | 400 | 500 |
| Comparative example 7 | 27 | 54 | 100 | — | — |

(2) Humidity-resistance test (bias-PCT test)

Bias voltage of 10 V was applied to a humdred in each case of the resin-sealed type semiconductor devices in steam of temperature 121° C. and pressure 2 atmospheres, and the breaking of aluminium wires in the devices due to corrosion was measured. The results are shown in Table 3.

TABLE 3

| Bias PCT: Cumulative deterioration rate (%) | | | | | |
|---|---|---|---|---|---|
| | Time (hrs) | | | | |
| | 100 | 200 | 300 | 400 | 500 |
| Embodiment 1 | 0 | 0 | 0 | 3 | 52 |
| Embodiment 2 | 0 | 0 | 0 | 4 | 57 |
| Embodiment 3 | 0 | 0 | 0 | 6 | 59 |
| Comparative example 1 | 0 | 0 | 63 | 100 | — |
| Comparative example 2 | 0 | 0 | 56 | 100 | — |
| Comparative example 3 | 0 | 0 | 32 | 100 | — |
| Comparative example 4 | 53 | 100 | — | — | — |
| Comparative example 5 | 69 | 100 | — | — | — |
| Comparative example 6 | 46 | 100 | — | — | — |
| Comparative example 7 | 100 | — | — | — | — |

(3) Laser marking characteristics test

Laser marking was carried out on each of the resin-sealed type semiconductor devices, using a carbon dioxide ($CO_2$) gas laser, and the marking characteristics evaluated.

Figure 2:
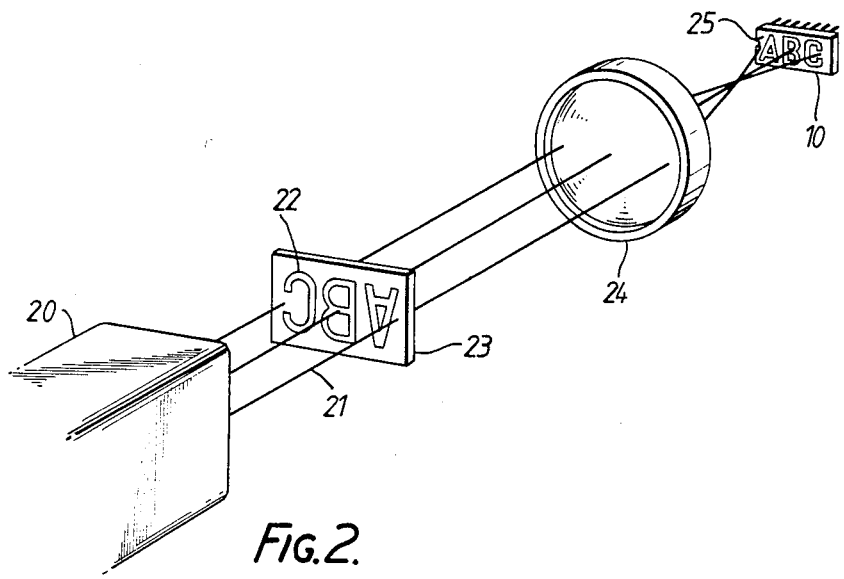
FIG. 2 is given in explanation of the method of laser marking used when embodiments of the invention were submitted to a characteristics test.

In this laser marking, as shown in FIG. 2, a laser beam 21 generated by a $CO_2$ gas laser generator 20 is directed onto a mask 23 carrying the required masking pattern in the form of slits. The laser beam thus transmitted then passes through an image formation lens 24 to form an image on the masked part of semiconductor device 10. When surface 25 of semiconductor device 10 is irradiated by this laser beam, the irradiated part only of that surface changes color, so that it is marked with the same pattern as that of mask 23.

Marking characteristics were evaluated by classifying the contrast in color between the marked and unmarked part (i.e. the ground) (the ground was black, while the part irradiated by the laser beam was whitened) into three grades, each represented by a symbol. "Contrast after heat treatment" refers to evaluation of the contrast after heat treatment of the masked samples for 10 hours at 200° C. The results as shown in Table 4.

TABLE 4

| | Contrast after marking | Contrast after heat treatment |
|---|---|---|
| Embodiment 1 | O | O |
| Embodiment 2 | O | O |
| Embodiment 3 | O | O |
| Comparative example 1 | Δ | X |
| Comparative example 2 | Δ | X |
| Comparative example 3 | X | X |
| Comparative example 4 | O | O |
| Comparative example 5 | Δ | X |
| Comparative example 6 | X | X |
| Comparative example 7 | O | O |

O ... good
Δ ... fairly poor
X ... poor

What is claimed is:

1. A resin-sealed type semiconductor device, in which the semiconductor element is sealed with resin, characterized in that the said resin is an epoxy resin composition comprising an epoxy resin, a curing agent having at least two phenolic hydroxyl groups per molecule, an organic phosphine compound and a metal complex dye.

2. The resin-sealed type semiconductor device of claim 1, in which the epoxy resin is a novolac-type epoxy resin having an epoxy equivalent of from 170 to 300.

3. The resin-sealed type semiconductor device of claim 1, in which the curing agent having at least 2 phenolic hydroxyl groups per molecule is a novolac-type phenol resin.

4. The resin-sealed type semiconductor device of claim 1, containing the organic phosphine compound in an amount of 0.01 to 5 parts by weight relative to 100 parts by weight of the resin ingredients of the composition.

5. The resin-sealed type semiconductor device of claim 1, containing the metal complex dye in an amount of 0.05 to 10 parts by weight relative to 100 parts by weight of the resin ingredients of the composition.

6. The resin-sealed type semiconductor device of claim 1, in which a pigment and a dye other than the metal complex dye are added to the said composition.

7. The resin-sealed type semiconductor device of claim 1, in which a pigment is added to the said composition.

8. The resin-sealed type semiconductor device of claim 1, in which a dye other than the metal complex dye is added to the said composition.

9. The resin-sealed type semiconductor device of claim 1, in which fused silica and crystalline silica are added to the said composition.

10. The resin-sealed type semiconductor device of claim 1, in which fused silica is added to the said composition.

11. The resin-sealed type semiconductor device of claim 1, in which crystalline silica is added to the said composition.

* * * * *